United States Patent
Dokumaci et al.

(10) Patent No.: US 6,833,569 B2
(45) Date of Patent: Dec. 21, 2004

(54) SELF-ALIGNED PLANAR DOUBLE-GATE PROCESS BY AMORPHIZATION

(75) Inventors: Omer H. Dokumaci, Wappingers Falls, NY (US); Bruce B. Doris, Brewster, NY (US); Suryanarayan G. Hegde, Hollowville, NY (US); Meikei Ieong, Wappingers Falls, NY (US); Erin C. Jones, Corvallis, OR (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/328,234

(22) Filed: Dec. 23, 2002

(65) Prior Publication Data

US 2004/0121549 A1 Jun. 24, 2004

(51) Int. Cl.$^7$ .............................................. H01L 27/148
(52) U.S. Cl. ...................... 257/250; 257/270; 257/302; 257/328; 438/156; 438/268; 438/283
(58) Field of Search .................................. 257/250, 270, 257/302, 328, 329, 347; 438/268, 283, 149, 156, 157

(56) References Cited

U.S. PATENT DOCUMENTS

| | | | |
|---|---|---|---|
| 6,004,837 A | | 12/1999 | Gambino et al. |
| 6,074,920 A | * | 6/2000 | Houston ..................... 438/289 |
| 6,365,465 B1 | | 4/2002 | Chan et al. |
| 6,372,559 B1 | | 4/2002 | Crowder et al. |
| 6,396,108 B1 | | 5/2002 | Krivpkapic et al. |
| 6,403,981 B1 | * | 6/2002 | Yu ............................... 257/63 |
| 6,433,609 B1 | | 8/2002 | Voldman |
| 6,541,345 B1 | * | 4/2003 | Komatsu ..................... 438/311 |
| 6,593,192 B2 | | 7/2003 | Zahurak et al. |
| 6,610,576 B2 | | 8/2003 | Nowak |
| 6,611,023 B1 | | 8/2003 | En et al. |
| 2002/0105039 A1 | | 8/2002 | Hanafi et al. |
| 2003/0193070 A1 | | 10/2003 | Chan et al. |
| 2003/0209761 A1 | | 11/2003 | Yagishita et al. |

OTHER PUBLICATIONS

P.M. Solomon, et al. (Jan. 2003) "A Planar Self–Aligned Double Gate MOSFET Technology to Achieve the Best on/off Switching Ratios as Gate Lengths Shrink", IEEE Circuits and Devices Magazine, p. 48–62.

Hon–Sum Philip, et al. (1997) "Self–Aligned (Top and Bottom) Double–Gate MOSFET with a 25 nm Thick Silicon Channel", IEEE, vol. 16, No. 6, pp. 1–4.

* cited by examiner

Primary Examiner—Hsien-Ming Lee
(74) Attorney, Agent, or Firm—Scully, Scott, Murphy & Presser; Wan Yee Cheung, Esq.

(57) ABSTRACT

The present invention provides a method for fabricating a planar DGFET having a back gate that is aligned to a front gate. The method of the present invention achieves this alignment by creating a carrier-depleted zone in portions of the back gate. The carrier-depleted zone reduces the capacitance between the source/drain regions and the back gate thereby providing a high-performance self-aligned planar double-gate field effect transistor (DGFET). The present invention also provides a planar DGFET having a back gate that is aligned with the front gate. The front to back gate alignment is achieved by providing a carrier-depleted zone in portions of the back gate.

17 Claims, 3 Drawing Sheets

SELF-ALIGNED PLANAR DOUBLE-GATE PROCESS BY AMORPHIZATION

FIELD OF THE INVENTION

The present invention relates to a double-gate field effect transistor (DGFET) device, and more particularly to a method of forming a planar double-gate field effect transistor having self-aligned front and back gates.

BACKGROUND OF THE INVENTION

In order to fabricate integrated circuits (ICs), such as memory, logic, and other devices, of higher integration density than currently feasible, one has to find a way to further downscale the dimensions of devices such as field effect transistors (FETs), which are present in an IC.

As FET dimensions are scaled down, FETs suffer from several problems. In particular, interactions between the source and drain of the FET degrade the ability of the gate to control whether the device is on or off. As the device size is reduced, the distance between source and drain regions of the FET is decreased leading to increasing interaction with the channel, thus reducing gate control. This phenomenon is called the "short-channel effect". Short-channel effects are well known to those skilled in the art as the decrease in threshold voltage, Vt, in short-channel devices, i.e., sub-0.1 micron, due to two dimensional electrostatic charge sharing between the gate and the source/drain regions.

An evolution beyond current CMOS devices is achieved through the application of a double-gate structure, wherein a channel is positioned between a front and a back gate. Positioning a channel between two gate structures allows for control of the gate from either side of the channel, hence reducing short-channel effects. In addition to improved short-channel effects, further advantages of the double-gate structure include, but are not limited to: higher transconductance and lower parasitic capacitance. With the use of a double-gate structure previous CMOS (complementary metal oxide semiconductor) devices can be scaled to half the channel length of conventional single gate structures. Double-gate structures are excellent candidates for future generation of high-performance CMOS devices.

Currently, both vertical and horizontal double-gate structures are being actively developed. The horizontal, i.e., planar, gate structure has several advantages over the vertical gate structures due to the similarity of the current state of the art CMOS devices. One major and formidable challenge of fabricating a planar double-gate device is aligning the back gate to the front gate.

In one prior art method, planar double-gate structures are formed by regrowing the channel after front to back alignment and definition. Another prior art method presently utilized to produce an aligned double-gate structure is to etch the back gate by using the front gate as an etch mask. Following the etching step, source/drain regions are regrown via selective epitaxial Si growth.

These prior methods for producing double-gate devices have numerous drawbacks due to severe difficulty with parameter control of the complex fabrication technology currently utilized in the production of double-gate FET devices. In view of the drawbacks mentioned with prior art methods of fabricating self-aligned planar DGFET devices, there is still a need for providing a new and improved method for fabricating the same. The method developed needs to avoid the fabrication complexity of prior art processes.

SUMMARY OF THE INVENTION

The present invention provides a method for fabricating a planar DGFET having a back gate that is aligned to a front gate. The method of the present invention achieves this alignment without experiencing any of the problems associated with prior art front to back gate alignment. The method of the present invention also provides a means for lowering the capacitance between the source/drain regions and the back gate.

In broad terms, the method of the present invention comprises the steps of:

providing a stacked double-gate structure comprising at least a back gate, a back gate dielectric located atop the back gate, a channel layer located atop the back gate dielectric, a front gate dielectric atop the channel layer, and a front gate located atop the front gate dielectric;

patterning the front gate of the stacked double-gate structure;

forming sidewall spacers on exposed sidewalls of the patterned front gate; and forming a carrier-depleted zone in portions of the back gate, wherein said carrier-depleted zone aligns the back gate to the front gate.

In addition to aligning the back gate to the front gate, the carrier-depleted zone improves device performance by lowering the capacitance between the source/drain regions and the back gate.

In one embodiment of the present invention, the carrier-depleted zone is an amorphous region that is located at the back gate/back gate dielectric interface. In this embodiment, implantation of ions that are capable of forming such an amorphous region is employed. The amorphous region defines the back gate in a self-aligned manner that is easily incorporated into a conventional process flow.

In another embodiment of the present invention, the carrier-depleted zone is a layer of bubbles that is located at the back gate/back gate dielectric interface. The layer of bubbles is created by ion implantation and annealing. The layer of bubbles defines the back gate in a self-aligned manner that is also easily incorporated into a conventional process flow.

Another aspect of the present invention relates to a self-aligned planar DGFET device. Specifically, the inventive DGFET device comprises:

a back gate dielectric located atop a back gate;

a channel layer located atop the back gate dielectric;

a front gate dielectric located atop the channel layer; and a patterned front gate located atop a portion of the channel region, wherein the back gate contains a carrier-depleted zone which aligns the back gate to the front gate.

The self-aligned planar DGFET of the present invention may also include a back-gate contact which is in contact with a surface portion of the back gate.

DETAILED DESCRIPTION OF THE INVENTION

Figure 1A:
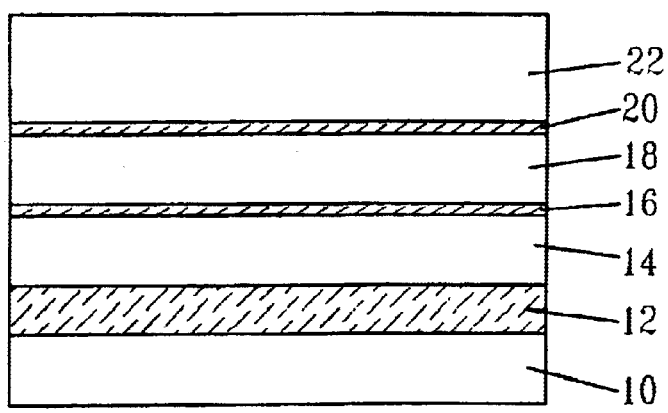
FIGS. 1A–1F are pictorial representations (through cross-sectional views) showing the basic processing steps that are employed in one embodiment of the present invention. In the illustrated embodiment, the carrier-depleted zone is an amorphous region.

The present invention, which provides a method of fabricating a self-aligned planar DGFET as well as the DGFET structure formed by the method of the present invention, will now be described in more detail by referring to the drawings that accompany the present application. It is noted that in the accompanying drawings, like reference numerals are used for describing like and corresponding elements.

Reference is first made to the embodiment shown in FIGS. 1A–1F. In the illustrated embodiment, the carrier-depleted region is an amorphous layer. FIG. 1A shows an initial stacked double-gate structure that may be employed in the present invention. The initial stacked double-gate structure comprises a substrate 10 having a bottom insulator 12 located thereon. The initial stacked double-gate structure also includes a back gate 14 located atop the bottom insulator 12, a back gate dielectric 16 located atop the back gate 14, a channel layer 18 located atop the back gate dielectric 16, a front gate dielectric 20 atop the channel layer 18, and a front gate 22 located atop the front gate dielectric 20.

The structure illustrated in FIG. 1A is fabricated by first providing a transfer wafer (not shown) which includes the channel layer 18. The channel layer may be formed atop of the transfer wafer or it may be a part of the transfer wafer. The channel layer 18 that is employed in the present invention includes any semiconducting material such as Si, SiGe, SiGeC, InAs, GaAs, InP and other III/V compound semiconductors. Combinations of these semiconducting materials, strained or unstrained, are also contemplated herein. The transfer wafer used at this point of the present invention may be a bulk Si wafer or another type of semiconductor wafer including silicon-on-insulators. When the channel layer 18 is not part of the transfer wafer, it is formed by a conventional deposition process including, for example, chemical vapor deposition (CVD), plasma-assisted CVD, evaporation or chemical solution deposition. When the channel layer is part of the transfer wafer, there is no need to form a separate channel layer atop the transfer wafer. The channel layer 18 may have any thickness when it is first applied to the transfer wafer. Typically, the channel layer 18 has an initial thickness of from about 1 to about 100 nm, which may be thinned after performing a subsequent bonding process.

The back gate dielectric 16 is then formed atop the channel layer 18 by utilizing a conventional deposition process or, alternatively, the back gate dielectric 16 may be formed by a thermal growing process. The back gate dielectric 16 may be composed of an oxide, nitride or oxynitride, with preference given to oxide dielectrics. Suitable examples of oxides that can be employed as the back gate dielectric 16 include, but are not limited to: $SiO_2$, $Al_2O_3$, $ZrO_2$, $HfO_2$, $Ta_2O_3$, $TiO_2$, perovskite-type oxides and combinations and multilayers thereof. The thickness of the back gate dielectric 16 may vary, but typically, the back gate dielectric 16 has a thickness of from about 0.5 to about 20 nm.

A back gate 14 composed of a conductive material such as polysilicon is then formed atop the back gate dielectric 16 utilizing a conventional deposition process such as CVD. The back gate 14 has a thickness of from about 50 to about 300 nm. Next, a bottom insulator 12 is formed atop the back gate 14 utilizing a conventional deposition process or a conventional thermal growing process. The bottom insulator 12 may be an oxide, nitride or oxynitride, with preference given to oxides such as $SiO_2$. The thickness of the bottom insulator 12 may vary, but typically the bottom insulator has a thickness of from about 10 to about 200 nm.

After the transfer wafer containing layers 18, 16, 14, and 12 is provided, the exposed surface of the bottom insulator 12 is bonded to the substrate 10 using a conventional bonding process that is well known to those skilled in the art. After bonding, the transfer wafer (or portions thereof not containing the channel layer) is removed from the bonded structure leaving the channel layer 18 exposed. Specifically, the transfer wafer or a portion thereof may be removed by grinding and etching. During the grinding and etching process, the channel layer 18 may be thinned to a thickness of less than 10 nm. A portion of this thinned channel layer 18 is used in the present invention as the body or channel region of the FET.

After the removal of the transfer wafer and thinning of the channel layer 18, a pad oxide, not shown, is formed atop the thinned channel layer 18 by utilizing a conventional deposition process or by utilizing a conventional thermal oxidation process. Notwithstanding which technique is employed, the pad oxide typically has a thickness of from about 5 to about 30 nm, with a thickness of from about 10 to about 20 nm being more highly preferred.

A polish stop layer (not specifically shown), which may be composed of a nitride and/or oxynitride, is then formed atop the pad oxide utilizing a conventional deposition process well known to those skilled in the art. The thickness of the polish stop layer may vary and is of no significant importance to the present invention.

Isolation trench openings, not shown in these drawings, are formed into the structure by first applying a conventional photoresist (not shown) to the surface of the polish stop layer utilizing a deposition process such as CVD or spin-on coating. The photoresist is then patterned by conventional lithography (including exposure and development) to contain a pattern for fabricating the shallow trench opening. With the patterned photoresist in place, an etching process such as reactive-ion etching (RIE), ion beam etching, or plasma etching is employed to transfer the trench pattern into the structure. During this etching step, portions of the channel layer 18, the back gate dielectric 16 and the back gate 14 are removed stopping on a surface of the bottom insulator 12.

Following the etching step, the patterned photoresist is removed utilizing a conventional stripping process, and thereafter a trench oxide liner (not shown) is formed via a thermal oxidation process so as to cover at least the exposed sidewalls of the trench opening. The isolation trench opening containing the trench oxide liner is then filled with a dielectric trench material such as a CVD oxide or tetraethylorthosilicate (TEOS) and planarized to the polish stop layer providing a planar structure shown. The isolation region 50 including the trench fill material and the trench oxide liner is shown, for example, in FIG. 3.

After forming the isolation regions, the polish stop layer is removed from the structure utilizing an etching process that is highly selective in removing the polish stop material as compared to oxide. This etching step of the present invention removes the polish stop from the structure and exposes the underlying pad oxide. For example, phosphoric acid can be used in selectively removing the polish stop layer from the structure. After the polish stop layer has been removed from the structure, the exposed pad oxide layer is selectively removed so as to expose the channel layer 18. Any conventional etching process that is highly selective in removing oxide as compared to semiconducting material can be employed. For example, hydrofluoric acid can be used in selectively removing the pad oxide from the structure.

After pad oxide has been selectively removed, the front gate dielectric 20 is formed atop the exposed surfaces of the channel layer 18. The front gate dielectric 20 may be composed of the same or different dielectric material as the back gate dielectric 16. Moreover, the front gate dielectric 20 may be formed utilizing any conventional deposition process such as CVD. The thickness of the front gate dielectric 20 may vary, but typically the front gate dielectric 20 has a thickness of from about 0.5 to about 3.0 nm.

Front gate 22 which is composed of a conductive material such as polysilicon, a conductive metal, a silicide, or any combination thereof, including multilayers is formed atop the structure utilizing a conventional deposition process providing the structure shown, for example, in FIG. 1A. The preferred material for the front gate 22 is polysilicon.

Figure 1B:
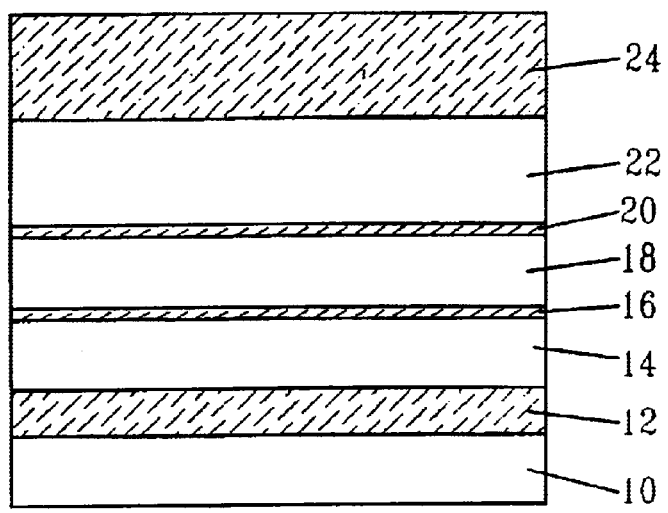
Figure 1C:
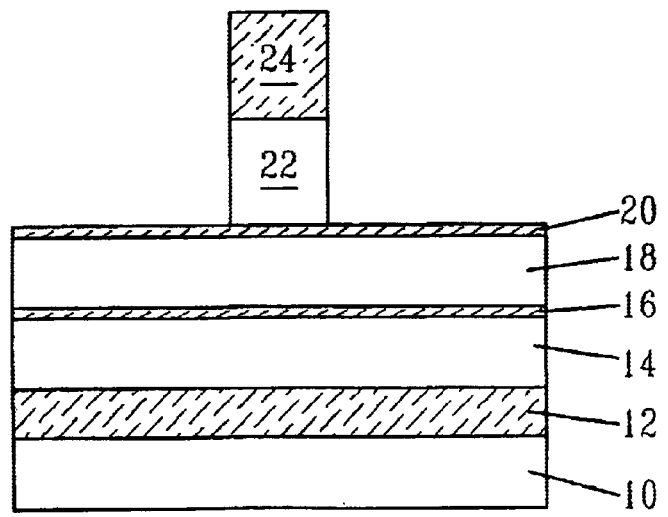

Next, and a shown, for example, in FIG. 1B, a mask 24 such as an oxide, nitride or oxynitride is formed via a conventional deposition process atop the front gate 22. Alternatively, the mask 24 may be formed by a thermal growing process. The mask 24 and the front gate 22 are then patterned providing the patterned structure shown, for example, in FIG. 1C. The patterning is achieved utilizing a patterned resist mask (not shown) and etching. The etching is selective to the front gate dielectric 20 therefore the etching stops on an upper surface of the front gate dielectric 20.

At this point of the present invention, source/drain extensions and halos (not specifically shown here) may be formed by conventional ion implantation and annealing. Alternatively, the formation of the source/drain extensions and halos may be performed at a later point of the method of the present invention.

Figure 1D:
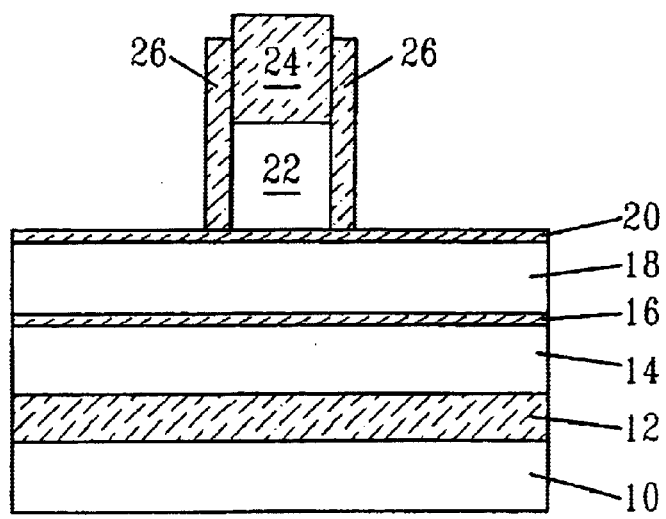
Figure 1E:
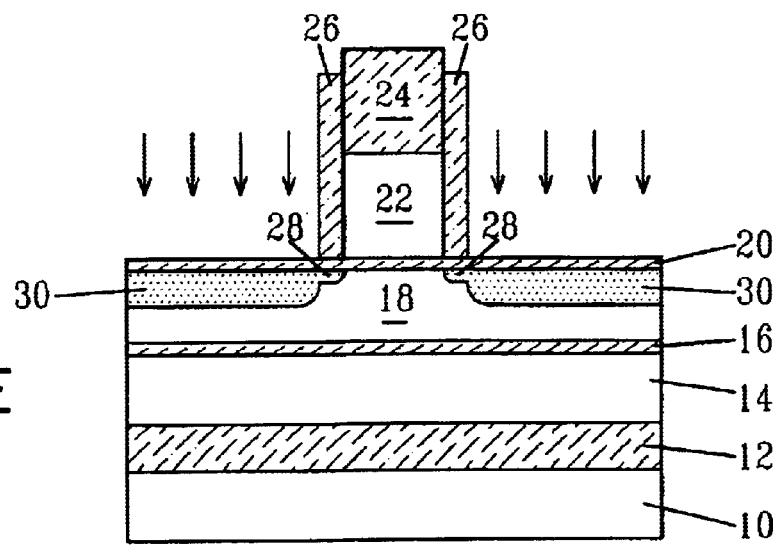

Insulating spacers 26 are formed on the exposed sidewalls of at least the patterned front gate 22 and a portion of the patterned mask 24 providing the structure, shown, for example, in FIG 1D. The insulating spacers 26 are composed of any insulating material including, for example, an oxide, nitride, oxynitride or any combination thereof. The insulating spacers 26 are formed by deposition of an insulating material and etching. After this step, selective epi may be formed to raise the source/drain region (not shown).

At this point of the present invention, and if not previously performed, extension regions 28 and halo regions (not shown) are formed into the channel layer 18 and thereafter source/drain regions 30 are formed adjoining the extension regions 28. The resultant structure including the extension regions 28 and the source/drain regions 30 is shown, for example, in FIG. 1E. In this drawing, the arrows represent ions being implanted into the channel layer 18. The extension regions 28 and halo regions, if not previously formed, are first ion implanted into the channel layer 18 and thereafter, the source/drain regions 30 are formed by a second ion implantation process. Following the ion implantations, the structure is annealed to activate the implant regions. The region between the source/drain regions is referred to herein as the channel region.

Figure 1F:
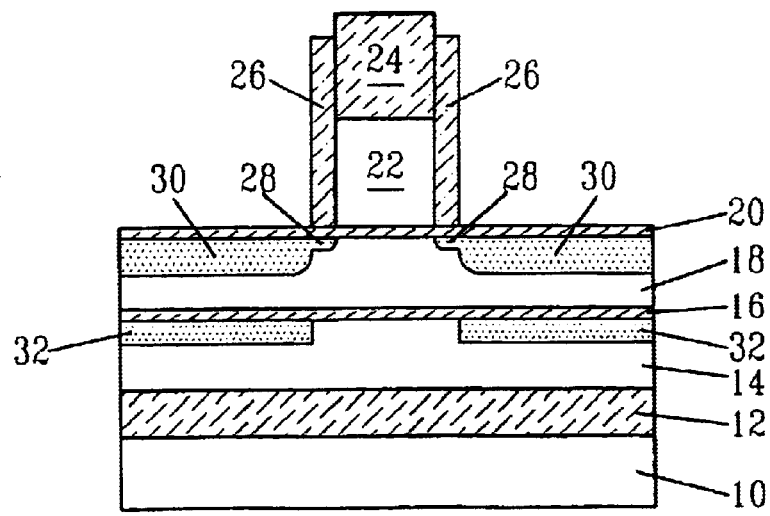

FIG. 1F shows the resultant structure that is formed after forming a carrier-depleted zone 32 in portions of the back gate 14. In the illustrated embodiment, the carrier-depleted zone 32 is an amorphous implant region which is formed by implanting ions that are capable of amorphizing portions of the back gate 14. Examples of ions which are capable of forming the carrier-depleted zone 32, i.e., amorphous region, in the back gate 14 include, but are not limited to: N, F, Ar, Si, Ge and the like. However, the ions should be selected such that the amorphous region within the back gate 14 does not regrow completely during the subsequent annealing steps such as silicidation anneals, as well as middle end and back end of the line anneals. N, F and Ar considerably slow down the regrowth of an amorphous layer. Therefore, N, F, Ar and any other amorphous layer growth slowing element are preferred elements for amorphous layer creation. Alternatively, one can create the amorphous layer with an element other than an amorphous layer growth slowing element and subsequently implant an amorphous layer growth slowing element into the amorphous layer. The implant is conducted utilizing conventional ion implantation conditions that are capable of forming an amorphous region in back gate 14. The amorphous layer can initially contain the source/drain regions 30 that are adjacent to the back gate dielectric 16. With optimum selection of implant conditions, the source/drain portion of the buried amorphous layer can be minimized or can be grown back during subsequent anneals. The implantation step can also be done after the silicidation step.

The implant is conducted utilizing conventional ion implantation conditions that are capable of forming an amorphous region in the back gate 14. As shown, the carrier-depleted zone 32 is formed at the interface between the back gate dielectric 18 and the back gate 14. The carrier-depleted zone 32 defines the back gate 14 in a self-aligned manner. Moreover, the carried depleted zone decreases the capacitance between the source/drain regions 30 and the back gate 14 providing a high-performance device.

Figure 2:
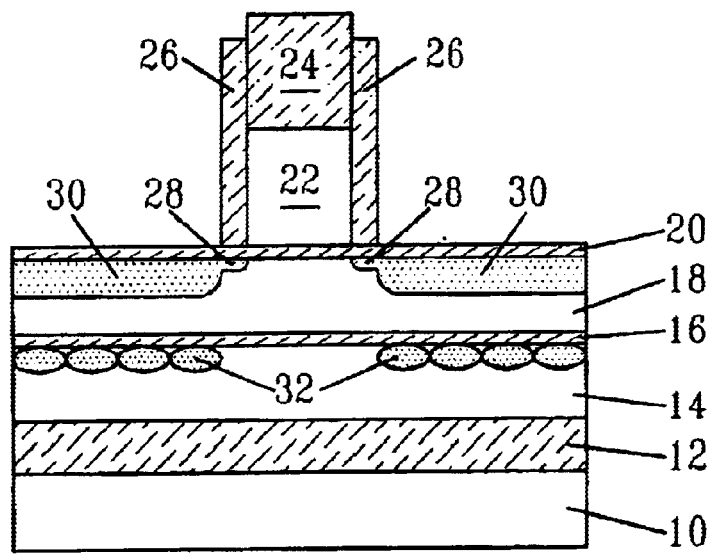
FIG. 2 is a pictorial representation (through a cross-sectional view) showing another embodiment of the present invention. In this embodiment, the carrier-depleted zone is a layer of bubbles.

FIG. 2 shows a second embodiment of the present invention wherein the carrier-depleted zone 32 is a layer of bubbles which is formed into portions of the back gate 14. In this embodiment of the present invention, the carrier-depleted zone 32 is formed by implanting ions that are capable of forming a layer of bubbles in the back gate 14. Suitable ions for use in this embodiment of the present invention include: hydrogen, Ar, He, Ne, Kr, Xe and the like. The implantation conditions employed in forming the layer of bubbles are conventional and are well known to those skilled in the art. An anneal is typically performed right after the implantation step to grow the bubbles. Since this anneal has a high thermal budget, the bubble formation step (implant and anneal) should preferably be performed before the extension/halo and source/drain formations steps. The bubble formation anneal is conducted at an elevated temperature of about 900° to about 1200° C. for a time period of from about 1 s to about 60 minutes.

Figure 3:
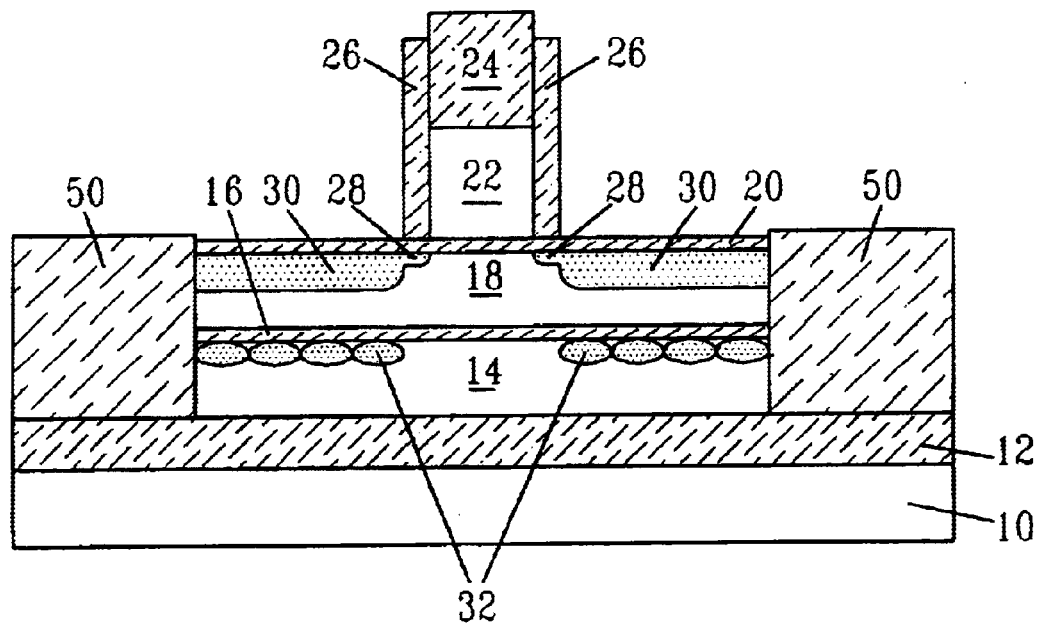
FIG. 3 is a pictorial representation (through a cross-sectional view) showing a final structure containing an isolation region. In this drawing, the embodiment of FIG. 2 is illustrated.

FIG. 3 shows a final self-aligned planar DFET structure of the present invention which includes isolation regions 50. The isolation regions 50 are formed as described above. After this structure is formed, usual middle end and back end of the line processes are done including back gate contact formation.

Although the present invention shows the formation of one double-gate FET structure, the present invention contemplates the formation of a plurality of such double-gate FET structures on a single substrate. The plurality of double-gate FETs may all include an amorphous region as the carrier-depleted zone or a layer of bubbles as the carrier-depleted zone. Alternatively, the plurality of double-gate FETs may include some DGFETs having an amorphous region as the carrier-depleted zone and some DGFETs having a layer of bubbles as the carrier-depleted zone.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a double-gate field effect transistor (DGFET) comprising the steps of:
   providing a stacked double-gate structure comprising at least a back gate, a back gate dielectric located atop the back gate, a channel layer located atop the back gate dielectric, a front gate dielectric atop the channel layer, and a front gate located atop the front gate dielectric;
   patterning the front gate of the stacked double-gate structure;
   forming sidewall spacers on exposed sidewalls of the patterned front gate; and
   forming a carrier-depleted zone in portions of the back gate, wherein said carrier-depleted zone aligns the back gate to the front gate and comprises an amorphous region or a layer of bubbles.

2. The method of claim 1 wherein said carrier-depleted zone reduces the capacitance between source/drain regions and the back gate.

3. The method of claim 1 further comprising implanting ions.

4. The method of claim 3 wherein said ions comprise N, F, Ar, Si or Ge.

5. The method of claim 3 wherein said ions comprise an amorphous layer growth slowing element.

6. The method of claim 1 further comprises implanting ions and annealing.

7. The method of claim 6 wherein said ions comprise hydrogen, Ar, He, Ne, Kr or Xe.

8. The method of claim 1 wherein said stacked double-gate structure is formed by bonding and thinning.

9. A double-gate field effect transistor (DGFET) comprising:
   a back gate dielectric located atop a back gate;
   a channel layer located atop said back gate dielectric;
   a front gate dielectric located atop said channel layer; and
   a patterned front gate located atop a portion of the channel layer, wherein the back gate contains a carrier-depleted region which aligns the back gate to the front gate, said carrier-depleted region comprises an amorphous layer or a layer of bubbles.

10. The DGFET of claim 9 further comprising insulating spacers on sidewalls of said patterned front gate.

11. The DGFET of claim 9 further comprising extension implant regions adjoining said source/drain regions.

12. The DGFET of claim 9 wherein said channel region comprises Si, SiGe, SiC, SiGeC, InAs, GaAs, InP, or combinations thereof.

13. The DGFET of claim 9 further comprising isolation regions formed adjacent to said patterned front gate.

14. The DGFET of claim 9 wherein said back gate dielectric and said front gate dielectric comprise oxides.

15. The DGFET of claim 9 wherein said back gate and said front gate are comprised of polysilicon.

16. The DGFET of claim 9 wherein carrier-depleted region reduces the capacitance between the source/drain regions and the back gate.

17. The DGFET of claim 9 wherein said channel layer comprises a III/V compound semiconductor.

* * * * *